(12) United States Patent
Kimura

(10) Patent No.: US 7,501,876 B2
(45) Date of Patent: Mar. 10, 2009

(54) LEVEL SHIFTER CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/873,424

(22) Filed: Oct. 17, 2007

(65) Prior Publication Data

US 2008/0164931 A1 Jul. 10, 2008

(30) Foreign Application Priority Data

Nov. 22, 2006 (JP) .............................. 2006-315547

(51) Int. Cl.
*H03L 5/00* (2006.01)
(52) U.S. Cl. ............................ 327/333; 326/68; 326/81
(58) Field of Classification Search ................... 326/62, 326/63, 68, 80, 81; 327/333; 365/189.11
See application file for complete search history.

(56) References Cited

U.S. PATENT DOCUMENTS

2006/0290404 A1* 12/2006 Law ........................... 327/333

FOREIGN PATENT DOCUMENTS

| JP | 2001036398 A | | 2/2001 |
|---|---|---|---|
| JP | 02003101403 A | * | 4/2003 |
| JP | 2004096616 A | | 3/2004 |

* cited by examiner

*Primary Examiner*—Long Nguyen
*Assistant Examiner*—Brandon S Cole
(74) *Attorney, Agent, or Firm*—Charles Bergere

(57) ABSTRACT

A level shifter circuit that properly operates even when the power supply voltage is unstable. A level shifter circuit includes a first level shifter unit, a second level shifter unit, and a latch unit. In the first level shifter unit, a transistor is connected to a power supply line to generate drive voltage that is lower than a first power supply voltage. The first level shifter unit outputs complementary signals from the drive voltage. The output of the first level shifter unit is provided to the second level shifter unit. The second level shifter unit converts a complementary signal to a signal having a second power supply voltage. Based on this signal, a signal of the latch unit is switched.

6 Claims, 4 Drawing Sheets

LEVEL SHIFTER CIRCUIT

BACKGROUND OF THE INVENTION

The present invention relates to a level shifter circuit for converting a voltage level in a semiconductor integrated circuit using a plurality of power supply voltages.

Power supply voltages for semiconductor integrated circuits have become lower to reduce power consumption. A semiconductor integrated circuit includes a plurality of circuit blocks having various functions and using various power supply voltages. Further, in a semiconductor integrated circuit, the signal level at an input/output terminal connected to an external device is determined in accordance with the characteristics of the connected device. Thus, power supply voltage that differs from that for internal circuits may become necessary.

Therefore, a semiconductor integrated circuit is supplied with a plurality of power supply voltages. A circuit unit, referred to as a level shifter, for converting signal levels is arranged on portions of a chip of the semiconductor integrated circuit where different power supply regions come into contact with one another (for example, refer to Japanese Laid-Open Patent Publication No. 2001-36398, first page and Japanese Laid-Open Patent Publication No. 2004-96616, FIG. 1). Japanese Laid-Open Patent Publication No. 2001-36398 describes a level shifter circuit including transistors (TP4 and TN4). Signals are input to the transistors to stop signal transmission when fluctuation occurs in the input to the level shifter circuit. Further, a latch circuit is used to stabilize an output signal by outputting a fixed potential that is dependent on an input signal held by the latch circuit.

Japanese Laid-Open Patent Publication No. 2004-96616 describes a level shifter circuit including an N-channel transistor (Mn8) connected between ground and the drains of N-channel transistors (Mn2 and Mn3) in a booster circuit. Low voltage power is applied to the gate of the N-channel transistor (MN8). A bus repeater is connected between the output terminal of the booster circuit and the input terminal of an inverter. When a low voltage power supply is grounded to reduce power supply, the N-channel transistor (Mn8) is deactivated. This prevents tunneling current from flowing in the booster circuit from a high voltage power supply to ground. Even if the potential at the gates of P-channel and N-channel transistors forming the booster circuit fluctuates, the bus repeater holds the output signal of the booster circuit immediately before such a fluctuation. This suppresses fluctuation of the output potential at the level shifter and prevents erroneous operations of circuits connected to the level shifter.

In a situation in which power is supplied to the output side, when power is not supplied to the input side or when power is about to be supplied to the input side, activation of the level shifter may transmit an erroneous signal to the output side. However, in the technique described in Japanese Laid-Open Patent Publication No. 2001-36398, the input side and the output side are separately operated. Thus, control is executed by an input from terminal (C). As a result, a mechanism for controlling the input of terminal (C) in accordance with the state of terminal (A) is necessary.

In the technique described in Japanese Laid-Open Patent Publication No. 2004-96616, a low voltage power supply (VCCL) controls the transistor (Mn8). Since there is not enough margin, the transistor (Mn8) may erroneously operate when the low voltage power supply (VCCL) becomes somewhat high. Thus, normal circuit operation cannot be guaranteed.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The present invention provides a level shifter circuit that properly operates even when the power supply voltage is unstable.

One aspect of the present invention is a level shifter circuit including a first voltage conversion circuit for generating a drive voltage that is lower than a first power supply voltage supplied from the first power supply line and is in correspondence with the first power supply voltage. The first voltage conversion circuit generates and outputs complementary signals corresponding to an input signal using the drive voltage. A second voltage conversion circuit generates and outputs a signal corresponding to voltages of the complementary signals output from the first voltage conversion circuit using a second power supply voltage supplied from a second power supply line. An output latch circuit performs holding in accordance with the voltage of the signal output from the second voltage conversion circuit.

Other aspects and advantages of the present invention will become apparent from the following description, taken in conjunction with the accompanying drawings, illustrating by way of example the principles of the invention.

Figure 1:
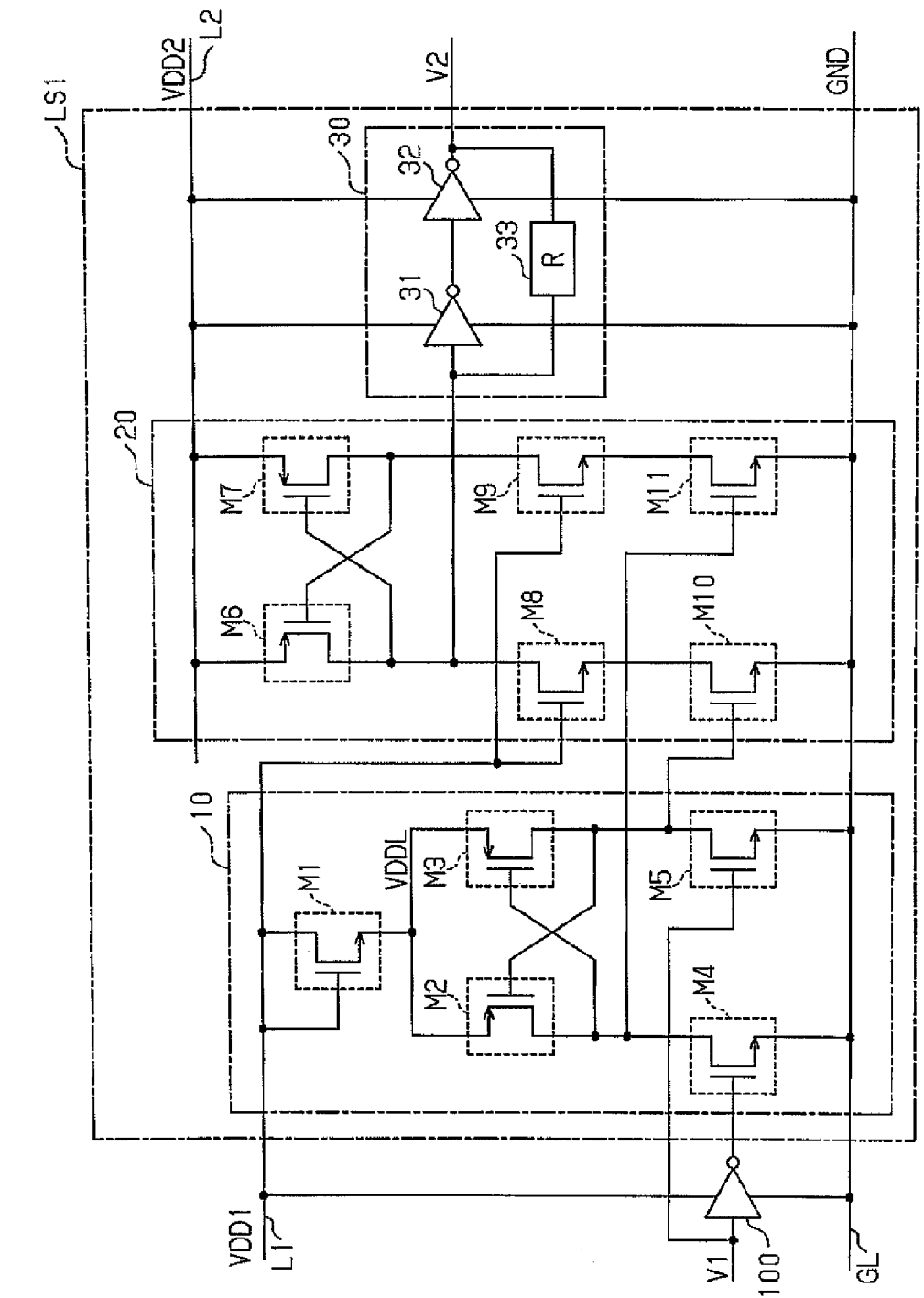
FIG. 1 is a circuit diagram of a level shifter circuit according to a preferred embodiment of the present invention.

A level shifter circuit LS1 according to a preferred embodiment of the present invention will now be described with reference to FIGS. 1 and 2. Referring to FIG. 1, in the level shifter circuit LS1, two power supply lines (L1 and L2) are connected to a ground line GL, which serves as a common line. The power supply line L1 is supplied with voltage VDD1 serving as a first power supply voltage. The power supply line L2 is supplied with voltage VDD2 serving as a second power supply voltage. In the preferred embodiment, the voltage VDD1 has a low potential, and the voltage VDD2 has a high potential. Here, it is assumed that the voltage at the power supply line L1 is increased from ground level to the voltage VDD1 when voltage VDD2 is being supplied.

The level shifter circuit LS1 includes two level shifter units and a latch unit 30, which serves as an output latch circuit. The two level shifter units include a first level shifter unit 10, which serves as a first voltage conversion circuit, and a second level shifter unit 20, which serves as a second voltage conversion circuit.

The first level shifter unit 10 is connected to the power supply line L1 and the ground line GL and receives a signal V1 via an inverter 100. The inverter 100 is connected to the power supply line L1 and the ground line GL and driven by the potential difference therebetween.

The first level shifter unit 10 includes a first transistor (transistor M1) having an n-channel (first conductive type) MOS structure and functioning as a voltage generation means having an operational threshold with respect to the first power supply voltage. The drain terminal and gate terminal of the transistor M1 is connected to the power supply line L1 and supplied with the voltage VDD1.

The source terminal of the transistor M1 is connected to the source terminals of a second transistor (transistor M2) and third transistor (transistor M3) having p-channel (second conductive type, which differs from the first conductive type) MOS structures. Voltage at a connection node of the transistors M2 and M3 is lower than the voltage VDD1 by an amount corresponding to the threshold voltage (Vth) of the transistor M1 and is used as voltage VDDL having a positive potential. The voltage VDDL is used as drive voltage for a differential amplification circuit formed by the transistors M2 to M5.

The gate terminal of the transistor M2 is connected to the drain terminal of the transistor M3. The gate terminal of the transistor M3 is connected to the drain terminal of the transistor M2.

Further, the drain terminal of the transistor M2 is connected to the drain terminal of a fourth transistor (transistor M4) having an n-channel structure. The gate terminal of the transistor M4 receives an inverted signal of the signal V1 from the inverter 100. The source terminal of the transistor M4 is connected to the ground line GL.

The drain terminal of the transistor M3 is connected to the drain terminal of a fifth transistor (transistor M5) having an n-channel MOS structure. The gate terminal of the transistor M5 receives the signal V1. The source terminal of the transistor M5 is connected to the ground line GL.

The drain terminals of the transistors M2 and M3 are each connected to the second level shifter unit 20.

The second level shifter unit 20 is connected to the power supply line L1, the power supply line L2, and the ground line GL.

In the second level shifter unit 20, the source terminals of a sixth transistor (transistor M6) and a seventh transistor (transistor M7) having p-channel MOS structures are connected to the power supply line L2. The gate terminal of the transistor M6 is connected to the drain terminal of the transistor M7. The gate terminal of the transistor M7 is connected to the drain terminal of the transistor M6.

The drain terminal of the transistor M6 is further connected to the drain terminal of an eighth transistor (transistor M8) having an n-channel MOS structure. The drain terminal of the transistor M7 is connected to the drain terminal of a ninth transistor (transistor M9) having an n-channel MOS structure. The gate terminals of the transistors M8 and M9 are each connected to the power supply line L1 and supplied with the voltage VDD1.

The source terminal of the transistor M8 is connected to the drain terminal of a tenth transistor (transistor M10) having an n-channel MOS transistor structure. The gate terminal of the transistor M10 is connected to the drain terminal of the transistor M3 (and to the drain terminal of the transistor M8) in the first level shifter unit 10. The source terminal of the transistor M10 is connected to the ground line GL.

Further, the source terminal of the transistor M9 is connected to the drain terminal of an eleventh transistor (transistor M11) having an n-channel MOS structure. The gate terminal of the transistor M11 is connected to the drain terminal of the transistor M4 (and to the drain terminal of the transistor M2) in the first level shifter unit 10. Further, the source terminal of the transistor M11 is connected to the ground line GL.

The drain terminal of the transistor M6 and the drain terminal of the transistor M8 in the second level shifter unit 20 are connected to the latch unit 30.

The latch unit 30 includes inverters 31 and 32 and a resistor element 33. The output terminal of the inverter 31 is connected to the input terminal of the inverter 32. The output terminal of the inverter 32 is connected to the input terminal of the inverter 31 via the resistor element 33. Further, the input terminal of the inverter 31 is connected to the drain terminal of the transistor M6 (and to the drain terminal of the transistor M8) in the second level shifter unit 20. The latch unit 30 holds the level of a latched signal until a forcible signal is input to the inverter 31 to output a signal V2.

The inverters 31 and 32 are connected to the power supply line L2 and the ground line GL and driven by the potential difference therebetween.

The operation of the level shift circuit LS1 will now be described with reference to FIG. 2. Here, a case in which the voltage VDD1 at the power supply line L1 is increased from the ground level to a predetermined value in a state in which the power supply line L2 is supplied with the voltage VDD2 will be discussed.

Figure 2:
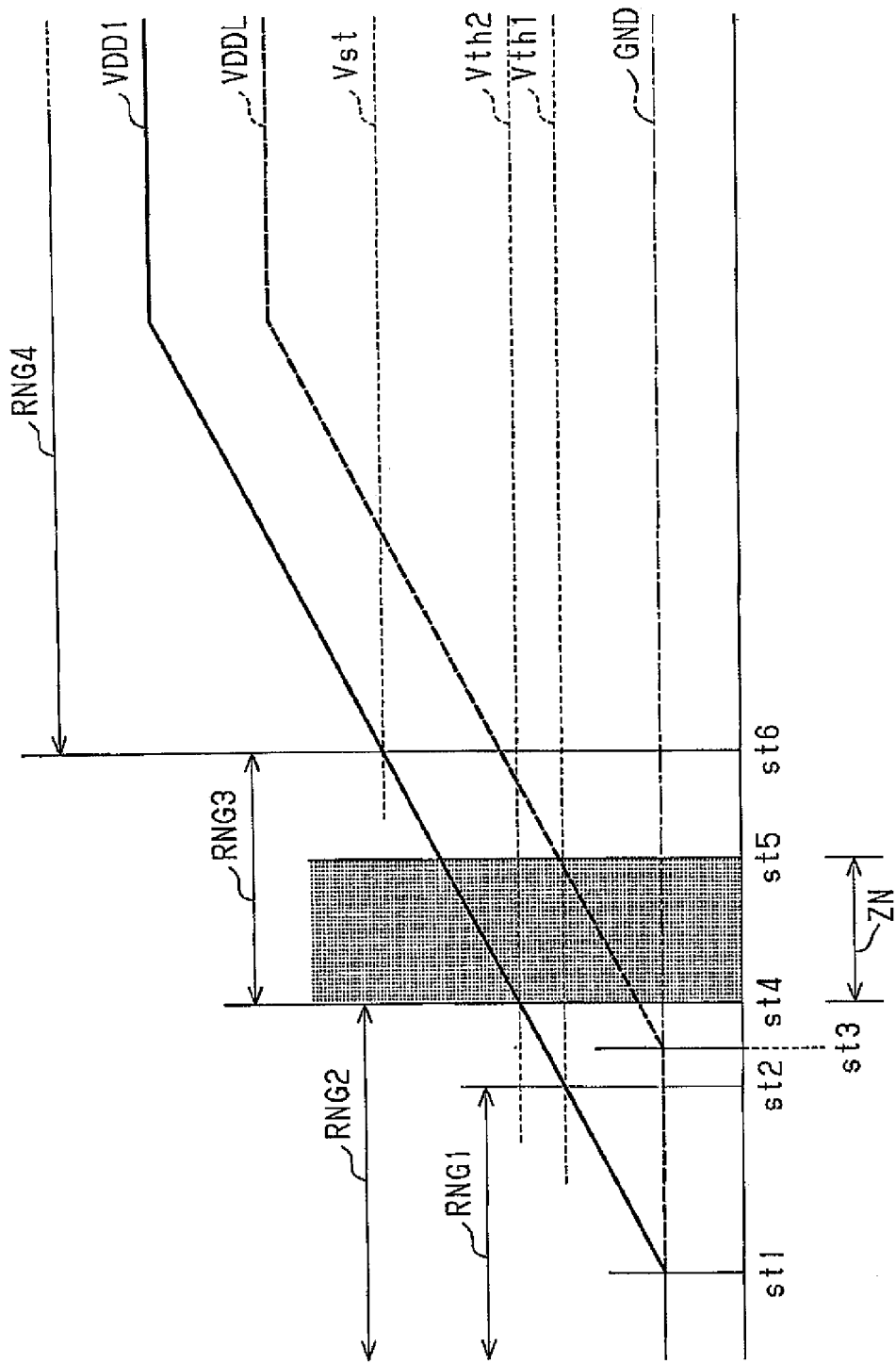
FIG. 2 is a graph illustrating the operation of the level shifter circuit of FIG. 1.

In FIG. 2, when the transistors of the first level shifter unit 10 have different threshold values, voltage Vth1 is used as the minimum threshold value of the transistors, and voltage Vth2 is used as the maximum threshold value of the transistors.

Further, voltage Vst is the voltage at which the voltage VDD1 is divided into an active mode and a standby mode. When the voltage VDD1 is lower than the voltage Vst, the level shifter circuit LS1 is in the standby mode. When the voltage VDD1 is greater than the voltage Vst, the level shifter circuit LS1 is in the active mode.

State st1 represents a state in which the supply of voltage VDD1 to the power supply line L1 is started. In state st2, the voltage VDD1 reaches the voltage Vth1. In range RNG1 from state st1 to st2, the transistors are all deactivated.

When the voltage VDD1 exceeds the voltage Vth1, transistors having low threshold voltages may be activated. In this case, however, the voltage VDDL is lower than the voltage VDD1 by an amount equal to the threshold value of the transistor M1. This delays the rising of the voltage VDDL. Accordingly, the transistors M10 and M11 that are controlled by the signal having the level of voltage VDDL remain deactivated.

When the voltage VDD1 reaches the threshold value of the transistor M1 in state st3, the voltage VDDL starts to rise with the voltage VDD1.

In range RNG2 extending to state st4 at which the voltage VDD1 reaches the voltage Vth2, there may be transistors that are not activated due to differences in threshold values. Accordingly, in range RNG2, a signal having the level of the voltage VDD1 may not be effective and becomes statically effective when going beyond state st4. Such a state continues in range RNG3 during which the voltage VDD1 exceeds voltage Vst and reaches state st5. In this state, the voltage VDDL is still low. Thus, the transistors M10 and M11 that are controlled by the signal having the level of the voltage VDDL remain deactivated.

In state st5 at which the voltage VDDL exceeds the voltage Vth2, a circuit formed by transistors having a low threshold value starts to function. Accordingly, until state st5, the signal V1 that is input to the level shifter circuit LS1 is ineffective and does not affect the signal V2, which is output from the level shifter circuit LS1.

In state st6 at which the voltage VDD1 exceeds the voltage Vst, the voltage VDD1 is significantly higher than the threshold value of the transistors M8 and M9. Thus, the second level shifter unit 20 is completely operable. As a result, the signal having the level of the voltage VDD1 is handled as an effective signal. That is, the signal V1 is transmitted via the level shifter units 10 and 20 and the latch unit 30 as the signal V2.

When the voltage VDD1 is low, the voltage VDDL is also low. Thus, internal elements of the first level shifter unit 10 (i.e., the transistors M2, M3, M4, and M5) are deactivated. The gate capacitors of the transistors M10 and Mu1 cannot be discharged even when they are charged. This may activate the transistors M10 and M11. In this case, without the transistors M8 and M9, the second level shifter unit 20 may be erroneously operated. The transistors M8 and M9 are used for this reason. More specifically, when the voltage VDD1 rises, the transistors M4 and M5 are in a proper state due to the inverter 100 before the transistors M8 and M9 are activated when the voltage VDD1 rises. Since the gate voltage of the transistors M10 and M11 are in a proper state, erroneous operation of the second level shifter unit 20 is prevented.

The level shifter circuit LS1 of the preferred embodiment has the advantages described below.

In the preferred embodiment, the level shifter circuit LS1 is formed by the two level shifter units 10 and 20 and the latch into 30. The transistor M1 of the first level shifter unit 10 generates the voltage VDDL, which is lower than the voltage VDD1. The voltage VDDL controls the transistors M10 and M11 of the second level shifter unit 20. This overlaps the range in which a signal having the level of the voltage VDD1 is effective with the range in which the operation of the second level shifter unit 20 is ineffective during range ZN, which extends from state st4 to st5. Such overlapping is not possible when the transistors M10 and M11 are controlled by the signal having the level of the voltage VDD1. Accordingly, an input signal is provided with a margin. Further, the output of an erroneous signal V2 is prevented during a transitional period of the voltage VDD1.

It should be apparent to those skilled in the art that the present invention may be embodied in many other specific forms without departing from the spirit or scope of the invention. Particularly, it should be understood that the present invention may be embodied in the following forms.

Figure 3:
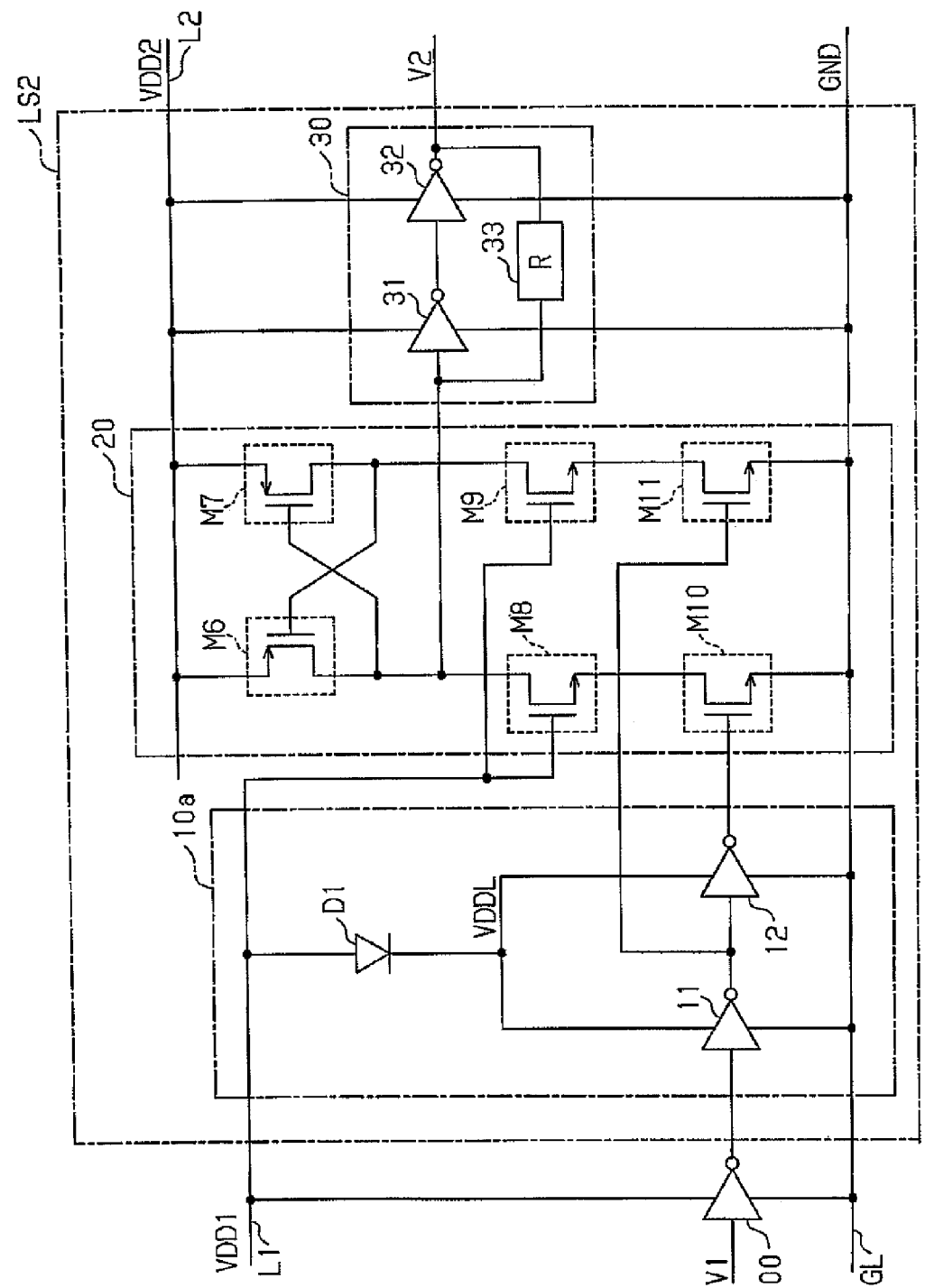
FIG. 3 is a circuit diagram of a level shifter circuit according to another embodiment of the present invention.

In the preferred embodiment, the transistor M1 of the first level shifter unit 10 is used to generate the voltage VDDL, which is lower than the voltage VDD1. However, a transistor does not have to be used as long as the voltage VDDL can be generated. For example, as shown in FIG. 3, a first level shifter unit 10a of a level shift circuit LS2 may include a diode D1. In this case, the anode terminal of the diode D1 is connected to the power supply line L1, and voltage VDDL is generated at the cathode terminal of the diode D1. Accordingly, the diode D1 generates the voltage VDDL, which is lower than the voltage VDD1.

In the preferred embodiment, complementary voltages supplied to the second level shifter unit 20 are generated with the transistors M2 to M5. If complementary voltages can be generated with the voltage VDDL that is lower than the voltage VDD1, a level shifter circuit LS2 shown in FIG. 3 may be used. A first level shifter unit 10a of the level shifter circuit LS2 includes first and second inverter elements (inverters 11 and 12). In this case, the output terminal of the inverter 11 is connected to the input terminal of the inverter 12. The input terminal of the inverter 11 receives an input signal. Then, voltages output from output terminals of the inverters 11 and 12 are provided to the second level shifter unit 20 as complementary signals.

Figure 4:
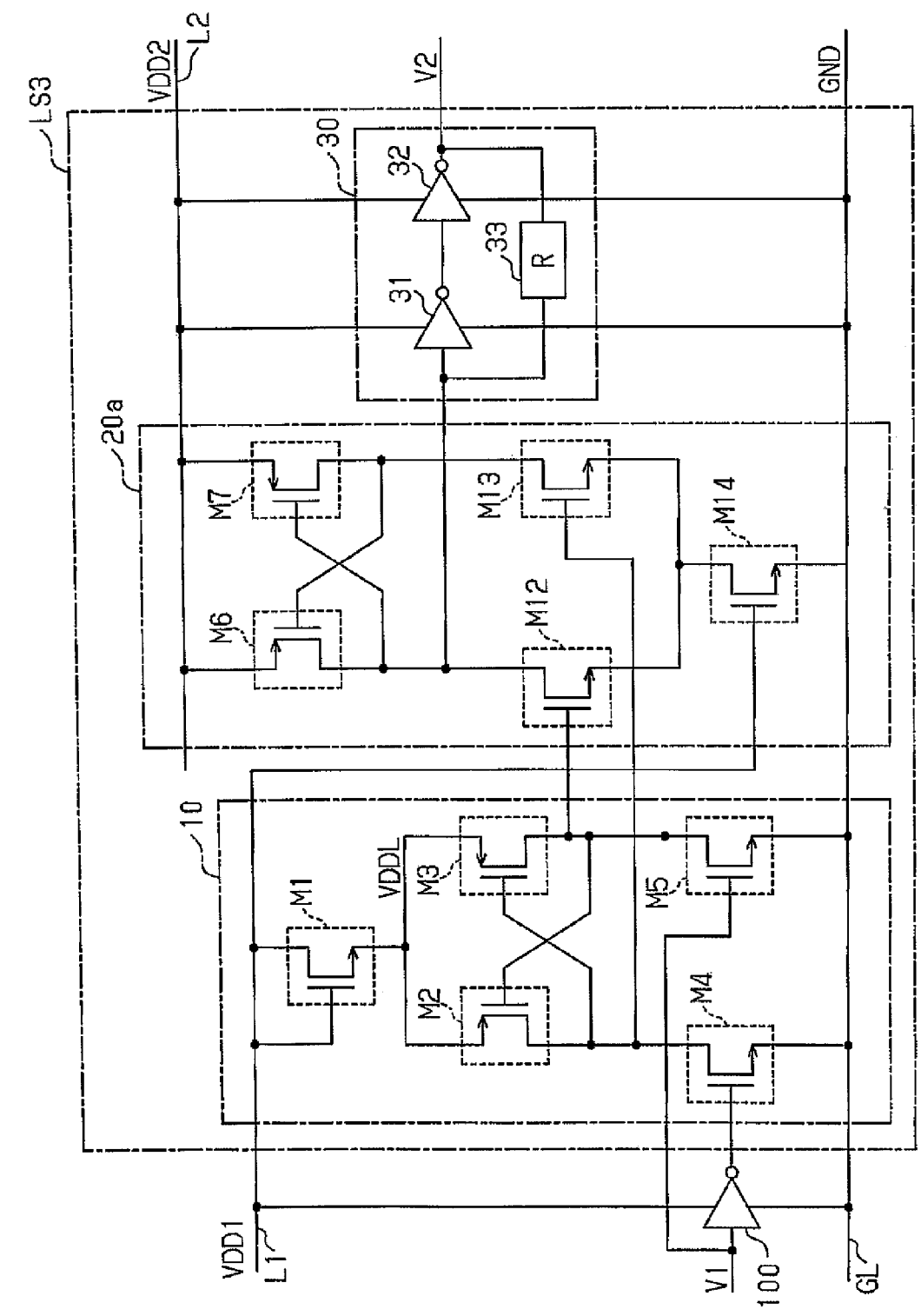
FIG. 4 is a circuit diagram of a level shifter circuit according to a further embodiment of the present invention.

In the preferred embodiment, the second level shifter unit 20 includes the transistors M6 to M11. Instead, a second level shifter unit 20a shown in FIG. 4 may be used to form a level shifter circuit LS3. In the second level shifter unit 20a, the drain terminal of the transistor M6 is further connected to the drain terminal of a twelfth transistor (transistor M12) having an n-channel MOS structure. The gate terminal of the transistor M12 is connected to the drain terminal of the transistor M3 (and the drain terminal of the transistor M5) in the first level shifter unit 10.

Further, the drain terminal of the transistor M7 is connected to a thirteenth transistor (transistor M13) having an n-channel MOS structure. The gate terminal of the transistor M13 is connected to the drain terminal of the transistor M4 (and the drain terminal of the transistor M2) in the first level shifter unit 10.

The source terminals of the transistors M12 and M13 are connected to the drain terminal of a fourteenth transistor (transistor M14) having an n-channel MOS structure. The source terminal of the transistor M14 is connected to the ground line GL. The gate terminal of the transistor M14 is connected to the power supply line L1 and supplied with the voltage VDD1.

In this case, mirror capacitance increases since the transistors M12 and M13, which receive the output signal of the first level shifter unit 10, is located in the proximity of the output of the second level shifter unit 20a (i.e., drain terminal of the transistor M12). However, the second level shifter unit 20a may be formed by fewer transistors.

In the preferred embodiment, the voltage VDD1 is a first power supply voltage having a low potential, and the voltage VDD2 is a second power supply voltage having a high potential. However, the first power supply voltage may be higher than the second power supply voltage.

The present examples and embodiments are to be considered as illustrative and not restrictive, and the invention is not to be limited to the details given herein, but may be modified within the scope and equivalence of the appended claims.

What is claimed is:

1. A level shifter circuit, comprising:
a first voltage conversion circuit for generating a drive voltage that is lower than a first power supply voltage supplied from a first power supply line and is in correspondence with the first power supply voltage, and generating and outputting complementary signals corresponding to an input signal using the drive voltage;
a second voltage conversion circuit, connected to the first voltage conversion circuit, for generating and outputting a signal corresponding to voltages of the complementary signals output from the first voltage conversion circuit using a second power supply voltage supplied from a second power supply line; and
an output latch circuit, connected to the second voltage conversion circuit, for receiving and holding the signal output from the second voltage conversion circuit,
wherein the first voltage conversion circuit includes:
a first transistor having a gate, a drain and a source, wherein the gate and drain are connected to the first power supply line, and the drive voltage is output at the source; and
a differential amplifier, connected to the first transistor, for generating the complementary signals corresponding to the input signal and an inverted input signal using the drive voltage output by the first transistor, and wherein the differential amplifier includes:
a second transistor having a source connected to the source of the first transistor;
a third transistor having a source connected to the source of the first transistor and a gate connected to a drain of the second transistor, and a drain connected to a gate of the second transistor;

a fourth transistor having a drain connected to the drain of the second transistor, a gate that receives the inverted input signal, and a source connected to a common line; and a fifth transistor having a drain connected to the drain of the third transistor, a gate that receives the input signal, and a source connected to the common line, wherein the drain terminals of the fourth and fifth transistors output the complementary signals provided to the second voltage conversion circuit.

2. The level shifter circuit of claim 1, wherein the first, fourth and fifth transistors are NMOS transistors and the second and third transistors are PMOS transistors.

3. The level shifter circuit of claim 1, wherein the second voltage conversion circuit includes:

a sixth transistor having a source connected to the second power supply line;

a seventh transistor having a source connected to the second power supply line, a gate terminal connected to a drain terminal of the sixth transistor, and a drain connected to a gate of the sixth transistor;

an eighth transistor having a drain connected to the drain of the sixth transistor and a gate connected to the first power supply line;

a ninth transistor having a drain connected to the drain of the seventh transistor and a gate connected to the first power supply line;

a tenth transistor having a drain connected to a source of the eighth transistor, a drain connected to the common line, and a gate that receives one of the complementary signals form the first voltage conversion circuit; and an eleventh transistor having a drain connected to a source of the ninth transistor, a drain connected to the common line, and a gate that receives the other one of the complementary signals from the first voltage conversion circuit.

4. The voltage conversion circuit of claim 3, wherein the sixth and seventh transistors are PMOS transistors and the eighth through eleventh transistors are NMOS transistors.

5. The voltage conversion circuit of claim 1, wherein the second voltage conversion circuit includes:

a sixth transistor having a source connected to the second power supply line;

a seventh transistor having a source connected to the second power supply line, a gate terminal connected to a drain terminal of the sixth transistor, and a drain connected to a gate of the sixth transistor;

a twelfth transistor having a drain connected to the drain of the sixth transistor and a gate that receives one of the complementary signals;

a thirteenth transistor having a drain connected to the drain of the seventh transistor and a gate that receives the other one of the complementary signals; and a fourteenth transistor having a drain connected to the sources of the twelfth and thirteenth transistors, a source connected to the common line and a gate connected to the first power supply line.

6. The voltage conversion circuit of claim 5, wherein the sixth and seventh transistors are PMOS transistors and the twelfth through fourteenth transistors are NMOS transistors.

* * * * *